US007250706B2

(12) United States Patent
Shiba

(10) Patent No.: US 7,250,706 B2
(45) Date of Patent: Jul. 31, 2007

(54) ECHO SOUNDER TRANSDUCER

(75) Inventor: Hiroshi Shiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/169,742

(22) Filed: Jun. 30, 2005

(65) Prior Publication Data

US 2006/0001334 A1 Jan. 5, 2006

(30) Foreign Application Priority Data

Jul. 1, 2004 (JP) ............................ 2004-195241

(51) Int. Cl.
*H01L 41/08* (2006.01)

(52) U.S. Cl. ...................................................... 310/325

(58) Field of Classification Search ................ 310/322, 310/325, 324, 330–332, 334, 337, 336, 367; 600/649; 367/158, 162, 163; 321/71.1; *H04R 17/10; H01L 41/08*

See application file for complete search history.

(56) References Cited

U.S. PATENT DOCUMENTS 4,633,119 A * 12/1986 Thompson .................. 310/325
5,998,908 A * 12/1999 Goodson .................... 310/325
6,181,052 B1 * 1/2001 Puskas ........................ 310/325
7,019,439 B2 * 3/2006 DeCastro et al. ........... 310/325

FOREIGN PATENT DOCUMENTS

| | | | |
|---|---|---|---|
| JP | 2000-209690 | | 7/2000 |
| JP | 2001-148896 | | 5/2001 |
| JP | 2003-032771 | | 1/2003 |
| JP | 200332771 | * | 1/2003 |

* cited by examiner

*Primary Examiner*—Darren Schuberg
*Assistant Examiner*—Karen Addison
(74) *Attorney, Agent, or Firm*—Young & Thompson

(57) ABSTRACT

The present invention achieves the wideband operation of a bolted Langevin-type echo sounder transducer by enabling low frequency operation with securing a sound pressure level above a certain level without changing the external dimensions of the echo sounder transducer. This is an echo sounder transducer includes a Langevin-type vibrator having a front mass and a rear mass, and a cylindrical active vibrator which is sandwiched between the front mass and rear mass, a bend vibrator constituted of a diaphragm arranged in an acoustic radiation surface section of the front mass of the Langevin-type vibrator, and a disc type active vibrator fixed to the diaphragm. This has such structure that a slit, communicating from an outer peripheral side face toward an axial center, is provided on the circumference in the side of the lower portion of the front mass of the Langevin-type vibrator toward the rear mass.

7 Claims, 13 Drawing Sheets

BEND VIBRATION MODE

SUPERIMPOSED VIBRATION MODE

LONGITUDINAL VIBRATION MODE

LONGITUDINAL VIBRATION MODE

SUPERIMPOSED VIBRATION MODE

BEND VIBRATION MODE

STOP STATE

VIBRATIONAL STATE

STOP STATE

VIBRATIONAL STATE

LONGITUDINAL VIBRATION MODE

SUPERIMPOSED VIBRATION MODE

BEND VIBRATION MODE

ECHO SOUNDER TRANSDUCER

BACKGROUND OF THE INVENTION

1. Field of the Invention

The present invention relates to an echo sounder transducer which emits an acoustic wave underwater by electroacoustic transduction, and in particular, to an echo sounder transducer suitable for the wideband operation of a Langevin-type echo sounder transducer which enables low frequency operation with securing a sound pressure level beyond a certain level without changing the external dimensions of the echo sounder transducer.

2. Description of the Prior Art

Generally, a Langevin-type echo sounder transducer is known as an echo sounder transducer which emits an acoustic wave underwater by electroacoustic transduction.

The Langevin-type echo sounder transducer is equipped with a bolted Langevin-type vibrator as vibration generating means, and emits an acoustic wave in a predetermined frequency band by applying a compressive stress to a piezoelectric ceramic stacked body sandwiched between a front mass and a rear mass by bolting.

Then, in such the Langevin-type echo sounder transducer, the wideband operation of the echo sounder transducer is achieved without changing the size of a Langevin-type vibrator by further providing bend vibration structure in an acoustic radiation surface side of the front mass of the Langevin-type vibrator, and superimposing a bend vibration mode on a longitudinal vibration mode of the Langevin-type vibrator (refer to patent document 1: Japanese Patent Laid-Open No. 2001-148896 (page 3 to 4, FIG. 1), and patent document 2: Japanese Patent No. 3005611 (page 3 to 4, FIGS. 1 and 2)).

Hereafter, such a conventional Langevin-type echo sounder transducer will be described with reference to drawings. FIG. 11 is a schematic perspective view showing the appearance of the Langevin-type echo sounder transducer, and FIG. 12 is a schematic diagram of the Langevin-type echo sounder transducer in which the bend vibration structure conventionally proposed is provided.

As shown in FIG. 11, a Langevin-type echo sounder transducer 100 is equipped with a Langevin-type vibrator 3 constituted of an active vibrator 9 which is constituted of a piezoelectric ceramic stacked body formed cylindrically and is sandwiched between the front mass 6 and rear mass 7. As shown in FIG. 12, by fastening bolt 8 which combine the front mass 6 and rear mass 7, a compressive stress is applied to the active vibrator 9, and hence, the vibration at a predetermined frequency occurs.

A bend vibrator 2 is installed on a front section of the front mass 6 of the Langevin-type vibrator 3, that is, in an acoustic radiation surface side thereof. The bend vibrator 2 is equipped with a diaphragm 5 which has a cavity therein and can perform bend vibration, and a disciform active vibrator 4 fixed to a back side (front mass 6) of the a diaphragm 5, and by applying a drive voltage, the active vibrator 4 vibrates and the diaphragm 5 performs bend vibration.

In addition, a phase shifter 10 is connected to the cylindrical active vibrator 9 of the Langevin-type vibrator 3, and the disciform active vibrator 4 of the bend vibrator 2 through leads 30, and phase control is performed so that the bend vibration mode of the bend vibrator 2 may become an opposite phase to the longitudinal vibration mode of the Langevin-type vibrator 3.

According to such the conventional Langevin-type echo sounder transducer 100, it is possible to use not only the longitudinal vibration mode of the Langevin-type vibrator 3 but also the bend vibration mode of the bend vibrator 2 by providing the bend vibrator 2 in front of the front mass 6 of the Langevin-type vibrator 3. Hence, it is possible to operate the echo sounder transducer at a low frequency, that is, a bend vibration resonance frequency lower than a longitudinal vibration resonance frequency of the Langevin-type vibrator 3.

In addition, it becomes possible by superimposing the bend vibration mode of the bend vibrator 2 on the longitudinal vibration mode of the Langevin-type vibrator 3 to widen the bandwidth of the echo sounder transducer to achieve wideband operation.

Furthermore, in order to achieve further wideband operation in such a Langevin-type echo sounder transducer, an echo sounder transducer which is formed by dividing a bend vibrator, which is provided on a front section of a front mass of a Langevin-type vibrator, into a plurality of sectors is also proposed (refer to patent document 3: Japanese Patent Laid-Open No. 2003-032771 (page 3 to 4, FIGS. 1 and 2)).

According to such an echo sounder transducer, since a plurality of bend vibrators which are divided into sectors respectively are set to have resonance frequencies different from each other and the bend vibration mode generated by the plurality of these bend vibrators is superimposed, further wideband operation of the echo sounder transducer is achieved.

Nevertheless, in a conventional Langevin-type echo sounder transducer like the above, there arose a problem that, first, in the case of the conventional echo sounder transducer shown in FIG. 12, since the coupling of vibration modes arose because of integral structure of the Langevin-type vibrator and bend vibrator, it was not possible to achieve wideband operation with securing a sound pressure level beyond a certain level.

In the Langevin-type echo sounder transducer being equipped with the bend vibrator, in a vibration mode between two resonance frequencies (in an intermediate area) in the bend vibration mode and longitudinal vibration mode, the bend vibration mode of the bend vibrator and the longitudinal vibration mode of the Langevin-type vibrator occur concurrently, and the two vibration modes are superimposed.

FIGS. 13A to 13C are explanatory diagrams showing schematically the states in respective vibration modes of the conventional echo sounder transducer shown in FIG. 12, and FIG. 13A shows the bend vibration mode, FIG. 13B shows a superimposed vibration mode, and FIG. 13C shows the longitudinal vibration mode. As shown in these figures, in the conventional echo sounder transducer 100 shown in FIG. 12, since the front mass 6 of the Langevin-type vibrator 3 and the diaphragm 5 of the bend vibrator 2 are coupled integrally in a joint 60, the whole bend vibrator 2 vibrates in a longitudinal direction in the form of being combined with the vibration of the Langevin-type vibrator 3 in the longitudinal vibration mode.

For this reason, although the bend vibrator 2 performs the bend vibration in the superimposed vibration mode, as shown in FIG. 13B, a fulcrum in the bend vibration mode moves from reference position ∇ to ▼ in a minus direction. Hence, a portion of vibrating in a positive direction and a portion of vibrating in a negative direction existed in a vibrating surface of the bend vibrator 2 with a neutral surface of acoustic radiation as a border (refer to hatched portions in this figure), as a result, positive and negative acoustic radiation pressures cancelled each other for a transmission level to drop remarkably (refer to "f4" in FIG. 3 described later).

In this way, in the conventional Langevin-type echo sounder transducer, the coupling of vibration modes arose because of integral structure of the Langevin-type vibrator and bend vibrator. Hence, the fulcrum in the bend vibration mode shifted reversely to an amplitude direction of the bend vibrator in the bend vibration mode by the longitudinal vibration mode of the Langevin-type vibrator, that is, in the minus direction largely rather than a reference position. Therefore, there arose a problem that acoustic radiation could not be performed.

For this reason, a sound pressure level in a frequency band (intermediate area) between a resonance frequency of the bend vibrator in the bend vibration mode and a resonance frequency of the echo sounder transducer in the longitudinal vibration mode dropped remarkably, and hence, it was not possible to widen the frequency band so that the sound pressure level beyond a certain level could be obtained.

On the other hand, in the case of the echo sounder transducer which was formed by dividing a bend vibrator into a plurality of sectors, and which is disclosed in patent document 3, the bend vibration mode of a sector-like bend vibrator is generated in a frequency higher than a resonance frequency of a Langevin-type vibrator in the longitudinal vibration mode. Hence, it was possible to widen a frequency band toward a high frequency.

However, in this echo sounder transducer, since the order of a resonance mode being generated became the order from the longitudinal mode to the bend mode, it was necessary to upsize the echo sounder transducer so as to widen the frequency band toward a low frequency.

The present invention is proposed so as to solve the problems which the above conventional technology has, and aims at providing an echo sounder transducer which can widen a using frequency band of the echo sounder transducer from a low frequency to a high frequency while securing a sound pressure level beyond a certain level without changing the external dimensions of the echo sounder transducer by separating the vibration modes of the Langevin-type vibrator and bend vibrator by forming a slit in a front mass of the Langevin-type vibrator.

BRIEF SUMMARY OF THE INVENTION

In order to achieve the above-described object, an echo sounder transducer of the present invention comprises a Langevin-type vibrator which has a front mass, a rear mass, and a cylindrical vibrator sandwiched between the front mass and rear mass, and has such structure that a slit communicating from an outer peripheral side face toward an axial center is provided in the front mass of the Langevin-type vibrator.

Specifically, it is preferable that the slit with which the echo sounder transducer of the present invention is equipped is formed on the circumference of an axial center of the front mass.

In addition, it is preferable that this slit is formed in a lower portion of the front mass with which the cylindrical vibrator is connected and the cylindrical vibrator is constituted of a plurality of stacked bodies.

Then, in particular, the echo sounder transducer of the present invention has such structure that a bend vibrator arranged on an acoustic radiation surface section of the front mass of the Langevin-type vibrator is provided.

Specifically, it is possible to adopt such structure that the bend vibrator provided in the echo sounder transducer of the present invention is constituted of a diaphragm arranged on the acoustic radiation surface section of the front mass, and a plate-like vibrator fixed to this diaphragm.

In addition, it is possible to adopt such structure that this bend vibrator is fixed to the acoustic radiation surface section of the front mass through an endpoint supporting structure.

Then, it is preferable that the slit is formed in a position where resonance frequencies of the bend vibrator and an acoustic radiation surface section side of the front mass with the slit as a border coincide nearly.

Furthermore, it is possible to adopt such structure that the echo sounder transducer of the present invention is equipped with front mass energizing means of energizing the acoustic radiation surface section of the front mass forward by changing the slit width of the slit.

Specifically, it is possible to adopt such structure that the front mass energizing means is constituted of a composite ring which has a plurality of vibrators and wedge-shaped elements which are annularly connected within the slit, and that the acoustic radiation surface section of the front mass is energized forward by the composite ring shrinking and extending in a circumferential direction by the shrinkage of the vibrator and the wedge-shaped elements sliding inside the slit in a circumferential direction.

In particular, it is preferable to adopt such structure that the composite ring shrinks and extends with synchronizing with the shrinking and extending of the Langevin-type vibrator.

According to the echo sounder transducer of the present invention which has the above structure, first, when excitation signals are concurrently inputted into the bend vibrator and Langevin-type vibrator, the bend vibration mode of the bend vibrator is excited in a diameter extending mode of the disciform active vibrator with which the bend vibrator is equipped. A resonance frequency in this bend vibration mode is not dependent on the total length of the echo sounder transducer, but is determined by the thickness size, weight, stiffness, and outer diameter size of the bend vibrator.

As a frequency of the excitation signals is increased gradually, the longitudinal vibration mode of the whole echo sounder transducer which is constituted of the Langevin-type vibrator and bend vibrator is excited. The resonance frequency in the longitudinal vibration mode is determined by the total length of the echo sounder transducer.

As to a vibration mode between two resonance frequencies (intermediate area) due to these bend vibration mode and longitudinal vibration mode, the bend vibration mode of the bend vibrator and the longitudinal vibration mode of the echo sounder transducer occur concurrently, and the two vibration modes are superimposed.

Here, in the conventional echo sounder transducer (refer to FIG. 12), since the front mass and diaphragm are coupled integrally in the joint, the whole bend vibrator vibrates in a longitudinal direction in a form of being combined with the vibration of the Langevin-type vibrator in the longitudinal vibration mode and the bend vibrator performs bend vibration. Nevertheless, since a vibrating surface of the bend vibrator vibrates in a positive direction and a negative direction with a neutral surface of acoustic radiation as a border, and positive and negative acoustic radiation pressures cancel each other, a transmission level drops remarkably.

In the present invention, when the Langevin-type vibrator is exciting the longitudinal vibration mode since the slit is provided in the front mass, an upper portion of the front mass with the slit as a border is bent in the direction of pushing up the whole bend vibrator so as to keep the fulcrum of the bend vibration mode of the bend vibrator in a reference position (refer to ∇ in FIG. 2A).

Hence, the bend vibration mode of the bend vibrator becomes independent of the longitudinal vibration mode of the Langevin-type vibrator, and hence, the acoustic radiation surface of the bend vibrator can vibrate wholly in a positive direction from the neutral surface of acoustic radiation.

Thus, in the echo sounder transducer of the present invention, since it becomes possible to raise a sound pressure level in an intermediate area by improving the vibration mode in the intermediate area where the sound pressure level dropped remarkably up to now, it becomes possible to widen a frequency band from a low frequency without changing the external dimensions of the echo sounder transducer.

According to the echo sounder transducer of the present invention, since the longitudinal vibration mode of the Langevin-type vibrator and the bend vibration mode of the bend vibrator are separated by providing the slit in the front mass of the Langevin-type vibrator, it is possible to keep the fulcrum of the bend vibration mode of the bend vibrator in a position before driving.

Thereby, in the Langevin-type echo sounder transducer which can perform low-frequency acoustic wave radiation using the bend vibration mode of the bend vibrator, and the longitudinal vibration mode of the whole echo sounder transducer without upsizing the dimensions of the echo sounder transducer, it becomes possible to widen a frequency band by raising a sound pressure level in a frequency band between the resonance frequencies in these two vibration modes (intermediate area). Hence, it becomes possible to achieve a wide bandwith securing a high sound pressure level from a low frequency area.

DETAILED DESCRIPTION OF THE PREFERRED EMBODIMENTS

Hereafter, preferable embodiments of an echo sounder transducer according to the present invention will be described with referring to drawings.

First Embodiment

First, a first embodiment of an echo sounder transducer according to the present invention will be described with referring to FIGS. 1 to 3.

Figure 1:
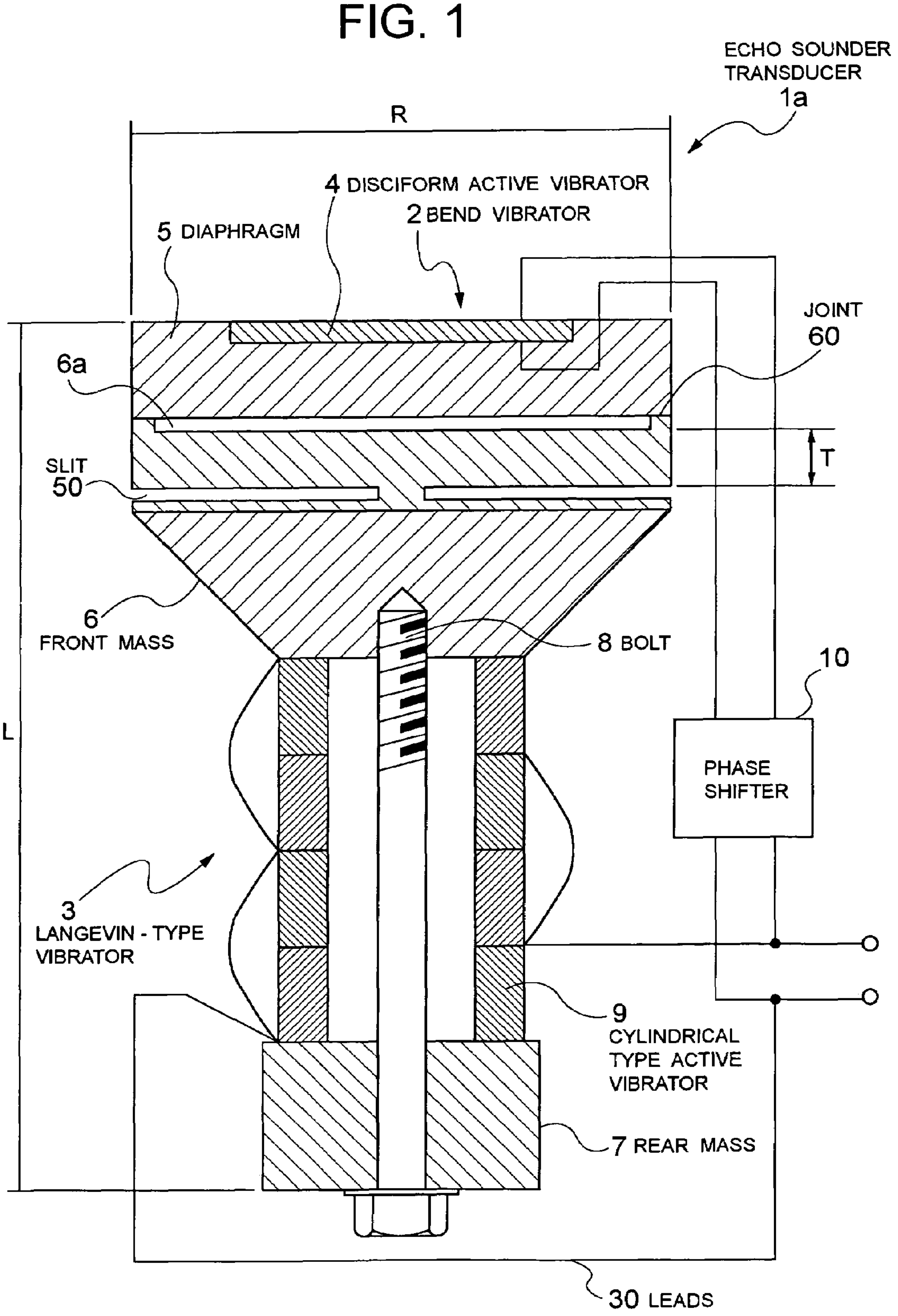
FIG. 1 is a schematic sectional diagram of an echo sounder transducer according to a first embodiment of the present invention.

FIG. 1 is a schematic sectional diagram of the echo sounder transducer according to the first embodiment of the present invention.

As shown in this figure, the present invention is a Langevin-type echo sounder transducer, and an echo sounder transducer la is an echo sounder transducer which is equipped with a Langevin-type vibrator 3, and is further equipped with a bend vibrator 2 on a front section, that is, an acoustic radiation surface section of the Langevin-type vibrator 3.

Figure 11:
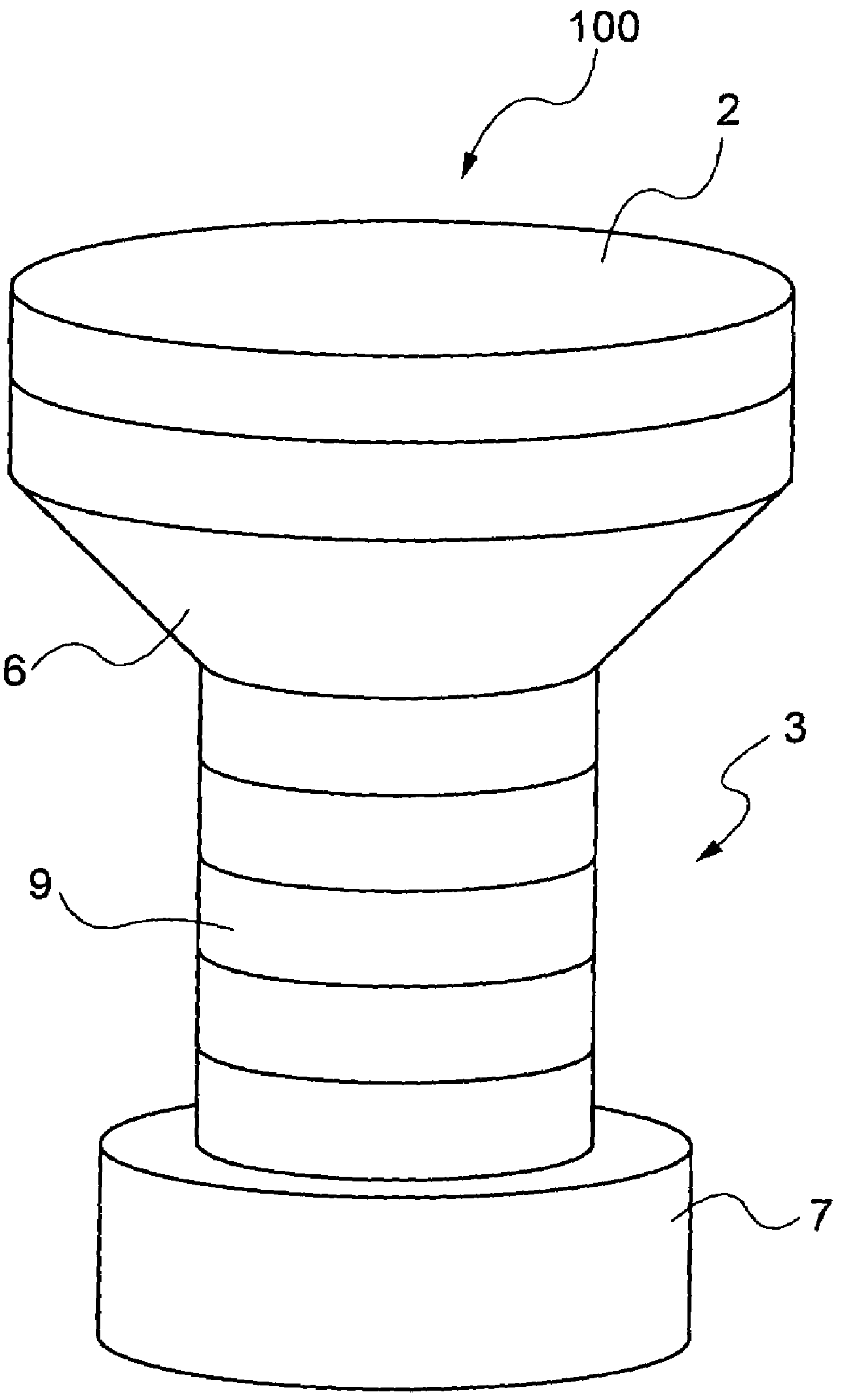
FIG. 11 is a schematic perspective view showing the appearance of an echo sounder transducer equipped with a general Langevin-type vibrator.

The appearance of this echo sounder transducer la is the same as that of the echo sounder transducer shown in FIG. 11 mentioned above.

The Langevin-type vibrator 3, as shown in FIG. 1, is equipped with a front mass 6 and a rear mass 7, and a cylindrical active vibrator 9 which is constituted of a piezoelectric ceramic stacked body and the like is arranged between these front mass 6 and rear mass 7.

The cylindrical active vibrator 9 is sandwiched between the front mass 6 and rear mass 7, as shown in FIG. 1, by fastening bolt 8 which combines the front mass 6 and rear mass 7, a compressive stress is applied to the active vibrator 9, and hence, the vibration at a predetermined frequency occurs.

The cylindrical active vibrator 9 which is constituted of a plurality of piezoelectric ceramic stacked bodies and the like is polarized in a thickness direction, and is arranged so that polarization directions may become inverse to each other, to be connected in parallel electrically.

In this way, the Langevin-type vibrator 3 can apply a static stress bias to a portion of the cylindrical active vibrator 9 by the front mass 6, rear mass 7, and bolt 8. Since the piezoelectric ceramic which constitutes the active vibrator 9 has strength to a tension which is a fraction of the strength to a pressure, the bolted Langevin-type oscillator which has means of applying such a static compressive stress is excellent in particular when being excited compulsorily in high power.

In addition, the outer diameter R of the acoustic radiation surface of the front mass of the Langevin-type vibrator 3 and the total length L of the echo sounder transducer (refer to FIG. 1) are set at predetermined length so that a desired resonance frequency may be obtained.

Then, a slit 50 communicating from a peripheral side face toward the axial center is provided in the front mass 6 of this Langevin-type vibrator 3.

As shown in FIG. 1, the slit 50 is formed so as to communicate from the peripheral side face of the front mass 6 toward the axial center, and is formed on the circumference of the axial center of the front mass 6 in a lower portion side of the front mass 6 with which the cylindrical active vibrator 9 is connected, in this embodiment.

By providing this slit 50, the longitudinal vibration mode of the Langevin-type vibrator 3 and the bend vibration mode of the bend vibrator 2 are separated.

The bend vibrator 2 is installed on a front section of the front mass 6 of the Langevin-type vibrator 3, that is, on an acoustic radiation surface side thereof.

The bend vibrator 2 is equipped with a diaphragm 5 in which bend vibration is possible, and a disciform active vibrator 4 which is fixed to the front face side (opposite side of the front mass 6) of the diaphragm 5 and which excites a diameter extending vibration mode.

A center portion of the front section of the front mass 6 to which the diaphragm 5 is fixed is formed in a concave, and the diaphragm 5 is fixed with means of an adhesive and the like at an edge of the front mass 6 standing around the outer periphery of the concave portion (joint 60). Thereby, a gap 6*a* is formed between the diaphragm 5 and front mass 6 so that the diaphragm 5 may become bendable.

In addition, the disciform active vibrator 4 is fit in the concave portion in a front face side of the diaphragm 5, and is fixed.

Then, by applying a drive voltage, the active vibrator 4 vibrates and the diaphragm 5 performs bend vibration.

Although being determined by the dimensions, stiffness, and weight of the bend vibrator 2, a resonance frequency of the bend vibrator 2 in the bend vibration mode is adjusted and set so as to become lower than the resonance frequency by the longitudinal vibration mode beforehand determined from the total length of the echo sounder transducer.

In addition, in this embodiment, a formation position of the slit 50 is set so that the thickness of the bend vibrator 2 and the thickness T (refer to FIG. 1) in the front face side of front mass 6 with the slit 50 as a border become predetermined values in order that a resonance frequency of the bend vibrator 2 and a resonance frequency of a portion in the acoustic radiation surface section side (a side of the bend vibrator 2) of the front mass 6 with the slit 50 as a border may coincide mostly.

Specifically, in this embodiment, the slit 50 is formed so that the weight of the bend vibrator 2 and the weight in the side of the front face of the front mass 6 with the slit 50 as a border may become almost the same.

Here, the disciform active vibrator 4 is a diaphragm which causes bend vibration, and it is preferable to be constituted of one kind of material which is selected from a group which is constituted of metal such as an Al alloy or a Ti alloy, fiber reinforced plastic such as carbon fiber, and fiber reinforced metal which uses Al, Mg, or the like as a base material, and which has light weight and high strength characteristics.

Figure 12:
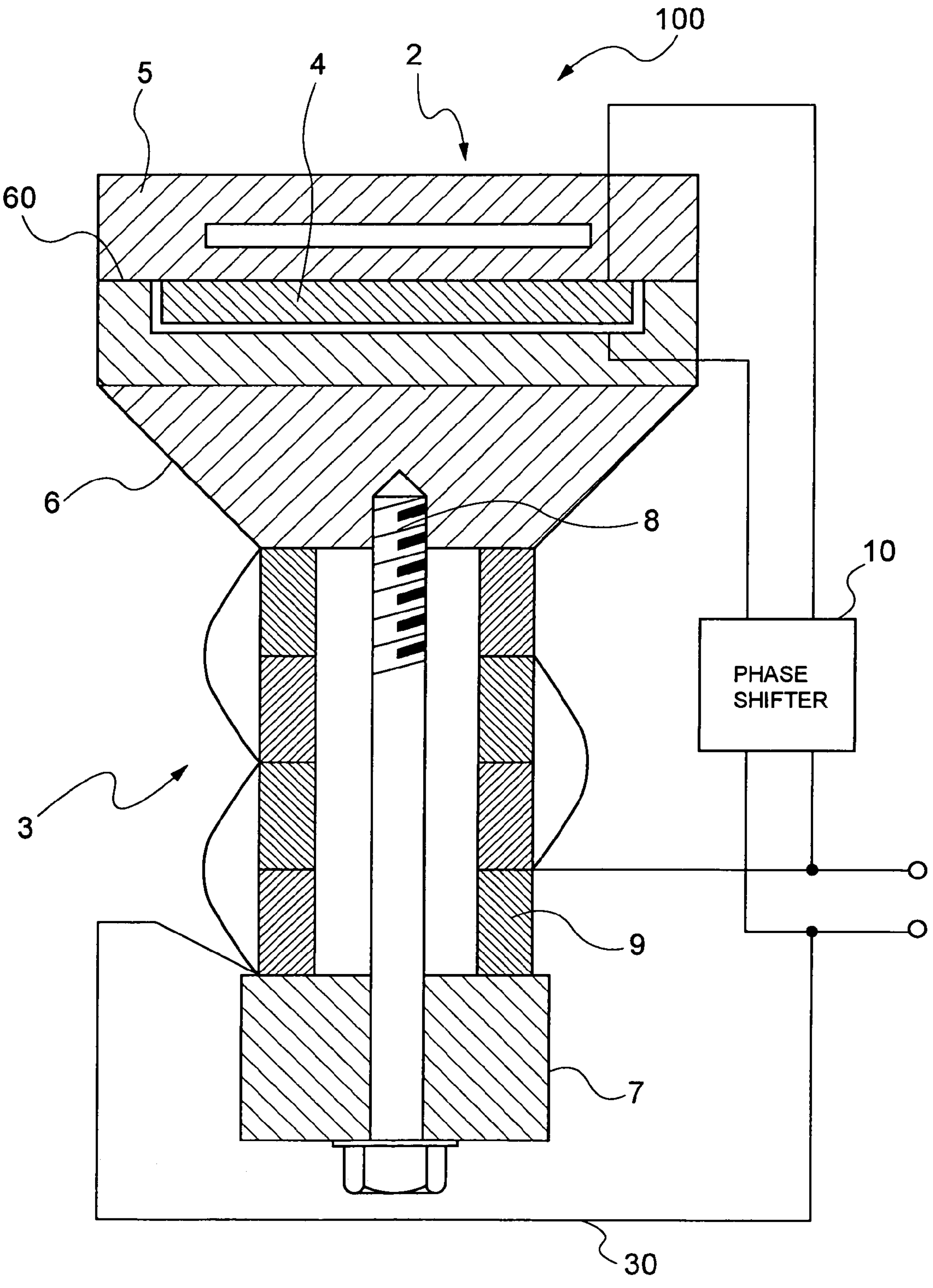
FIG. 12 is a schematic sectional diagram of a conventional echo sounder transducer.

Such the disciform active vibrator 4 is fit to the concave portion formed in the front section of the diaphragm 5, and is fixed with super glue or the like. The bend vibration mode of the diaphragm 5 is excited at the time of bend vibration. In addition, the fitting structure, a fixing method, and the like of the disciform active vibrator 4 to the diaphragm 5 are not limited to what are shown in this embodiment, for example, they may be such structure that the disciform active vibrator 4 is arranged at a back side of the diaphragm 5 shown in FIG. 12. In addition, it is also possible completely to perform integration with an electron beam deposition method and the like instead of an adhesive as fixing means.

In addition, the phase shifter 10 is connected to the cylindrical active vibrator 9 of the Langevin-type vibrator 3, and the disciform active vibrator 4 of the bend vibrator 2 through leads 30, and phase control is performed so that the bend vibration mode of the bend vibrator 2 may become an opposite phase to the longitudinal vibration mode of the Langevin-type vibrator 3.

Electrically, a lead of the cylindrical active vibrator 9 of the Langevin-type vibrator 3 is connected to a lead wired to the disciform active vibrator 4 of the bend vibrator 2 through the phase shifter 10.

Next, the operation of the echo sounder transducer of this embodiment which is constituted in such the structure mentioned above will be described with referring to FIGS. 2A, 2B, 2C, and 3.

Figure 2A:
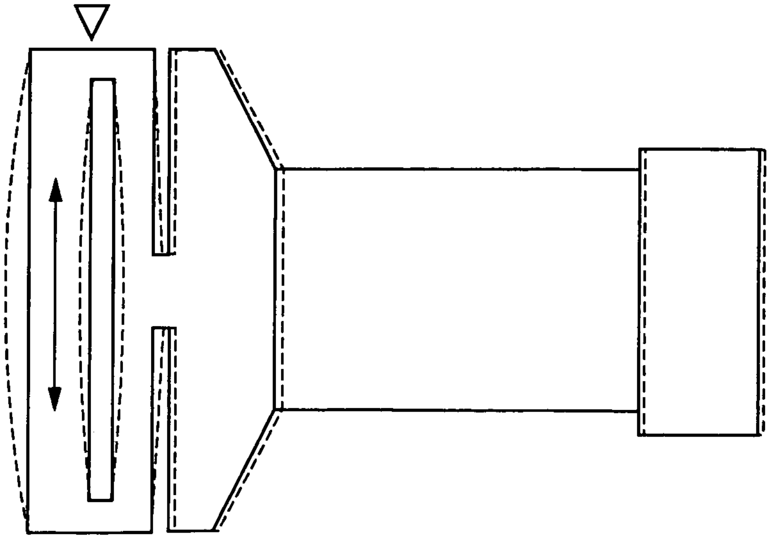
FIGS. 2A to 2C include explanatory diagrams of vibration modes of the echo sounder transducer shown in FIG. 1.
Figure 2B:
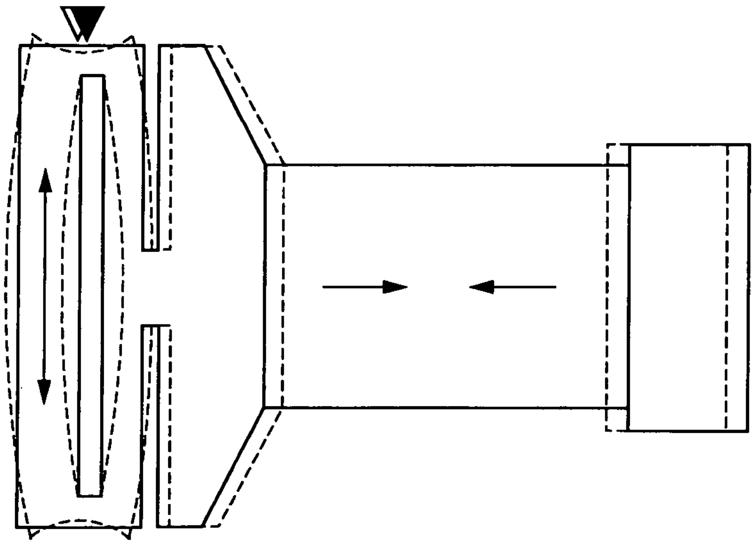
Figure 2C:
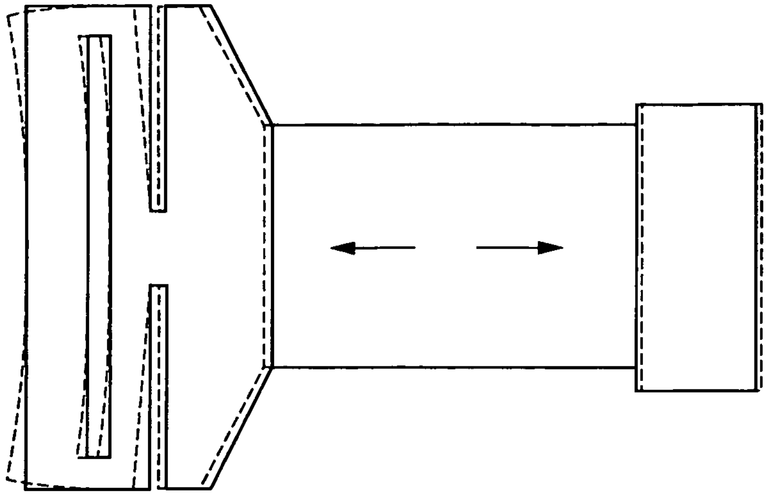

FIGS. 2A to 2C are explanatory diagrams showing schematically the states in respective vibration modes of the echo sounder transducer of this embodiment, and FIG. 2A shows the bend vibration mode, FIG. 2B shows the superimposed vibration mode, and FIG. 2C shows the longitudinal vibration mode. FIG. 3 is a graph showing the relationship between the sound pressure level and the frequency characteristics in the echo sounder transducer of this embodiment and the conventional echo sounder transducer.

The echo sounder transducer 1*a* gives an electric signal to the leads 30, excites the disciform active vibrator 4 and cylindrical active vibrator 9, and generates mechanical vibration.

Figure 3:
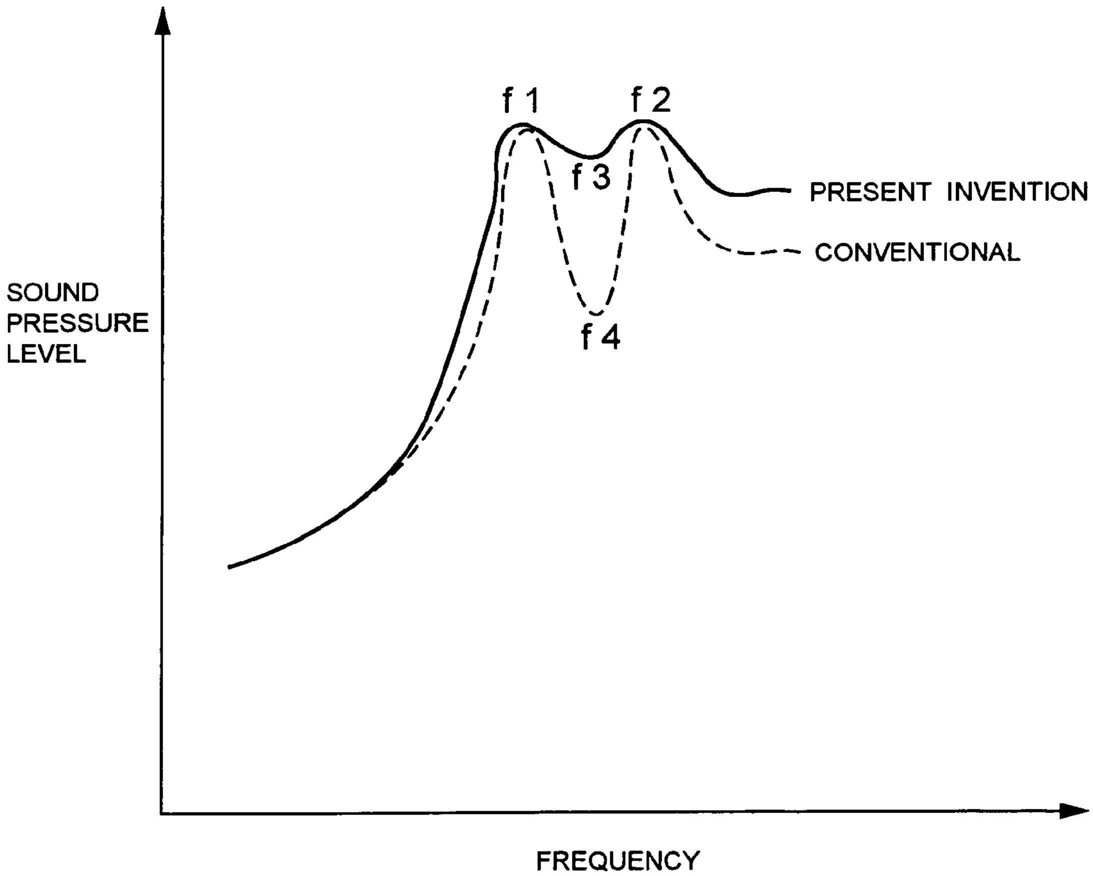
FIG. 3 is a graph showing the relationship between the sound pressure level and the frequency characteristic of the echo sounder transducer according to the present invention.

First, with making a frequency of the given electric signal be the same as a mechanical resonance frequency which is generated in the bend vibration mode of the bend vibrator 2, the bend vibration mode of the bend vibrator 2 with the joint 60 as the fulcrum occurs (the state shown in FIG. 2A and by "f1" in FIG. 3). At this time, acoustic wave radiation is performed above the bend vibrator 2.

Then, the frequency of the electric signal is raised gradually to coincide with the same frequency as an intermediate area. The bend vibrator 2 generates the bend vibration mode succeedingly, and the Langevin-type vibrator 3 generates the longitudinal vibration mode since the whole cylindrical active vibrators 9 which are stacked extends and shrinks, and thereby, the superimposing mode of the bend vibration mode and longitudinal vibration mode is generated.

When the phase shifter 10 performs adjustment beforehand so that the disciform active vibrator 4 and the Langevin-type vibrator 3 may be driven in reversed phases, and the Langevin-type active vibrator 3 vibrates in a shrinking direction in the longitudinal vibration mode, the bend type vibrator 2 performs vibration in bend mode in an extending direction, that is, a direction where an acoustic surface jumps out of a neutral position of the acoustic surface before driving to a positive direction (the state shown in FIG. 2B and by "f3" in FIG. 3).

At this time, since being adjusted for its dimensions so as to coincide with a resonance frequency in the bend mode of the bend vibrator 2, a structure in the side of the bend vibrator 2 of the front mass 6 with the slit 50 as a border, as shown in FIG. 2B, performs bend vibration so as to face with the amplitude of the bend vibrator 2 in the bend vibration mode, and also, in a direction reverse to the vibration direction of the Langevin-type vibrator 3.

Thereby, the joint 60 which becomes a fulcrum of the bend vibrator 2 in the bend vibration mode can maintain the almost same positional relation as the position before driving (refer to ∇ and ▼ which are shown in FIG. 2B), and hence, acoustic wave radiation is performed above the bend vibrator 2.

Furthermore, when the frequency of the electric signal is set at the same as the mechanical resonance frequency of the echo sounder transducer 1*a* in the longitudinal vibration mode, a longitudinal vibration mode by the expansion and contraction of the whole echo sounder transducer which includes the bend vibrator 2 and the Langevin-type vibrator 3 occur (the state shown in FIG. 2C and by "f2" in FIG. 3).

At this time, acoustic wave radiation is performed above the bend vibrator 2.

Figure 13C:
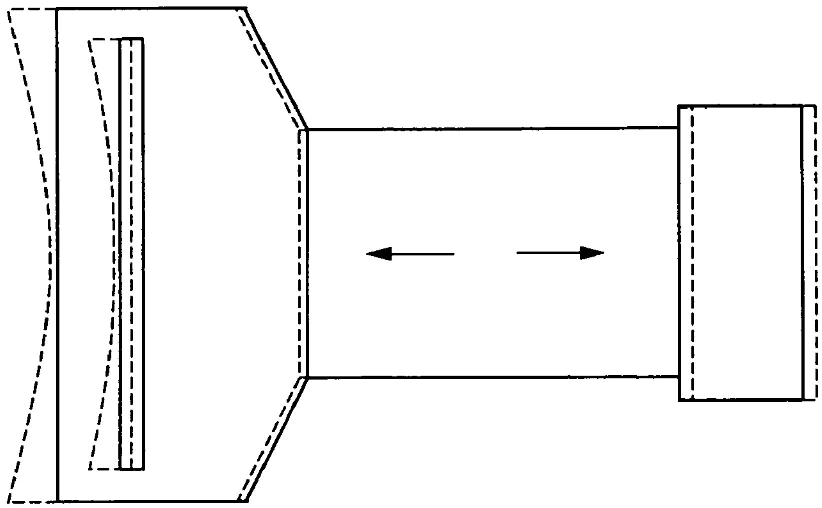
FIGS. 13A to 13C are explanatory diagrams of vibration modes of the conventional echo sounder transducer shown in FIG. 12.
Figure 13B:
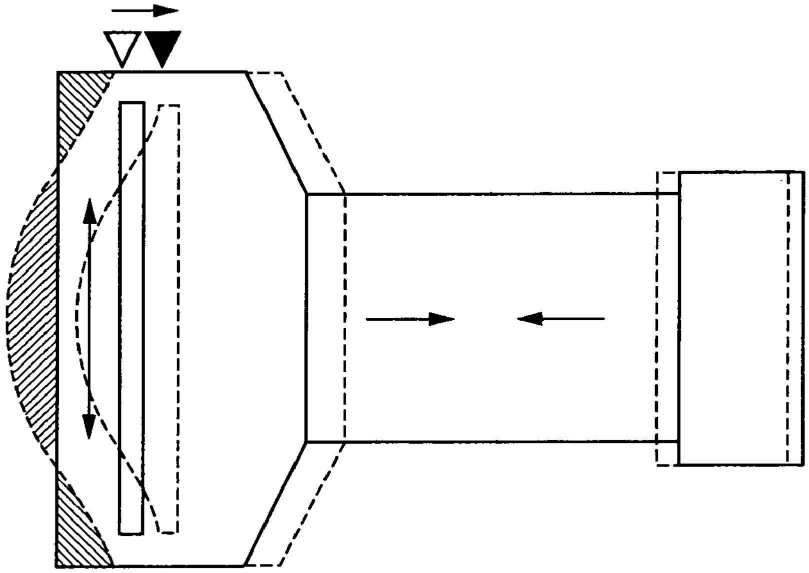
Figure 13A:
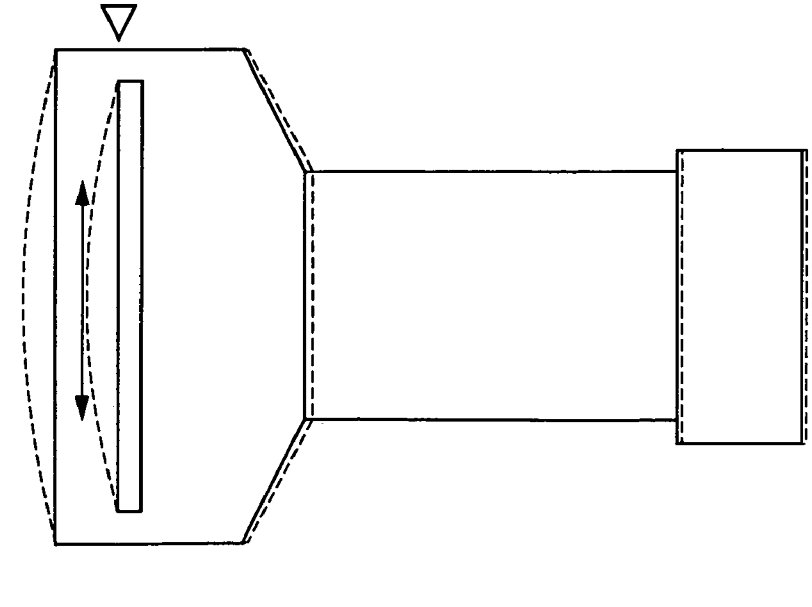

On the other hand, in the conventional echo sounder transducer 100 (refer to FIG. 12) mentioned above, in the superimposed vibration mode, as shown in FIG. 13B, a fulcrum of the bend vibrator 2 in the bend vibration mode moves from the reference position ∇ to ▼ in a minus direction, and hence, a portion which vibrates in a positive direction with the neutral surface of acoustic radiation as a border, and a portion which vibrates in a negative direction exist in the vibrating surface of the bend vibrator 2 (refer to the hatched portions in this figure).

For this reason, in the conventional echo sounder transducer 100, the positive and negative acoustic radiation pressures cancel each other, and hence, a transmission level drops remarkably (the state shown by "f4" in FIG. 3).

As described above, according to the echo sounder transducer according to this embodiment, when the Langevin-type vibrator 3 is exciting the longitudinal vibration mode since the slit 50 is provided in the front mass 6 of the Langevin-type vibrator 3, an upper portion of the front mass 6 with the slit 50 as a border can be bent in a direction of pushing up the whole bend vibrator so as to keep a fulcrum of the bend vibrator 2 in the bend vibration mode in a reference position (refer to ∇ in FIG. 2).

Thereby, the bend vibration mode of the bend vibrator 2 becomes independent of the longitudinal vibration mode of the Langevin-type vibrator 3, and hence, the acoustic radiation surface of the bend vibrator 2 can vibrate wholly in a positive direction from the neutral surface of acoustic radiation.

Thus, in the echo sounder transducer 1*a* of this embodiment, since it becomes possible to raise a sound pressure level in an intermediate area by improving the vibration mode in the intermediate area where the sound pressure level dropped remarkably in the conventional echo sounder transducer, it becomes possible to widen a frequency band from a low frequency without changing the external dimensions of the echo sounder transducer.

Second Embodiment

Next, a second embodiment of an echo sounder transducer according to the present invention will be described with referring to FIG. 4.

Figure 4:
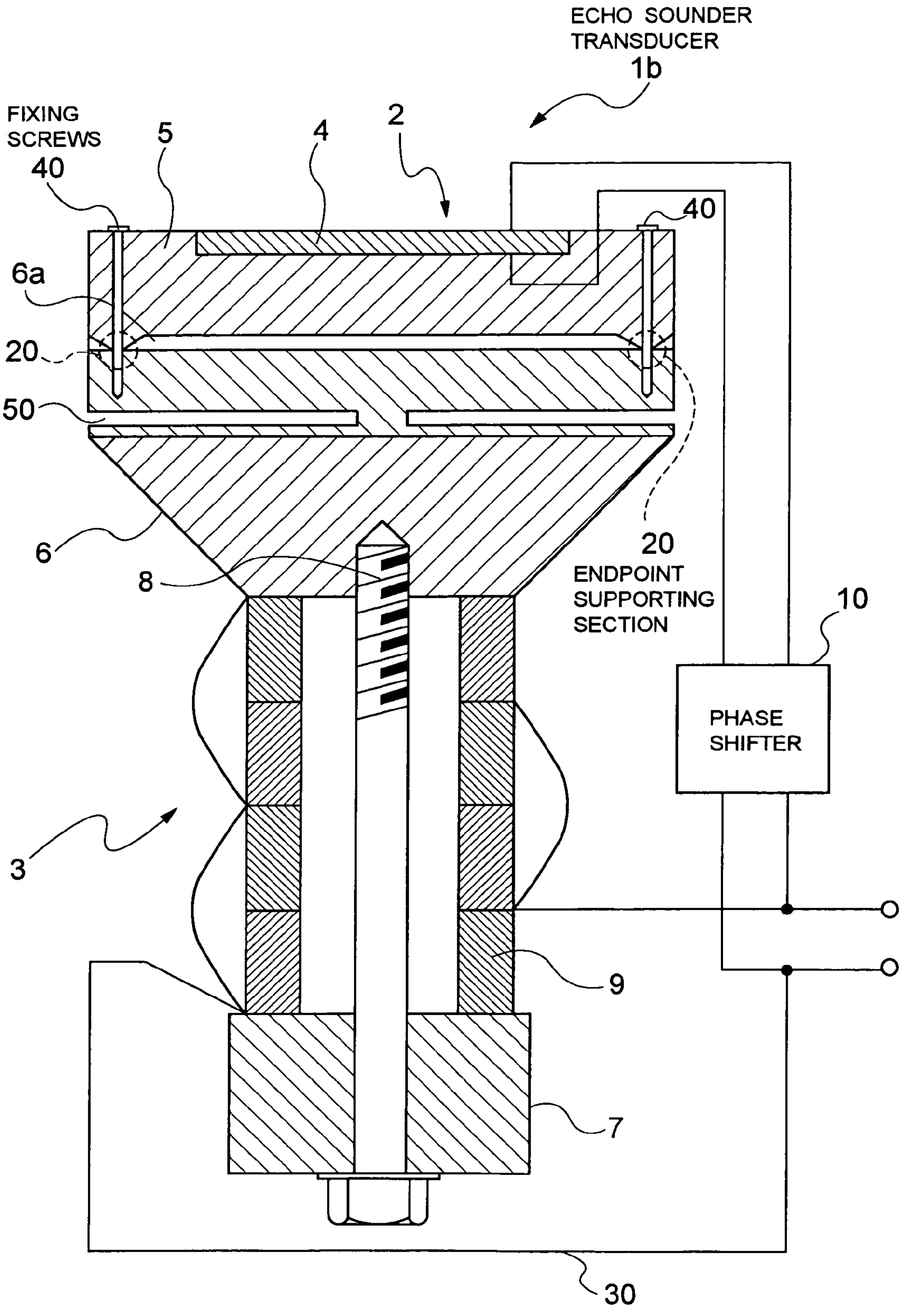
FIG. 4 is a schematic sectional diagram of an echo sounder transducer according to a second embodiment of the present invention.
Figure 5C:
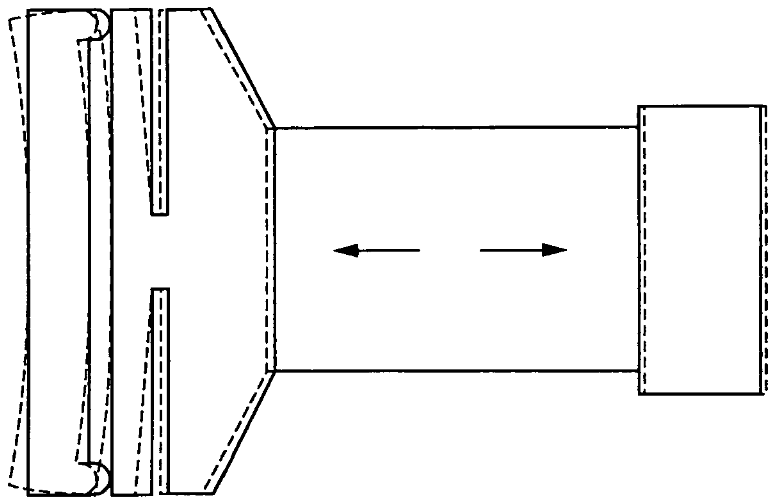
FIGS. 5A to 5C include explanatory diagrams of vibration modes of the echo sounder transducer shown in FIG. 4.
Figure 5B:
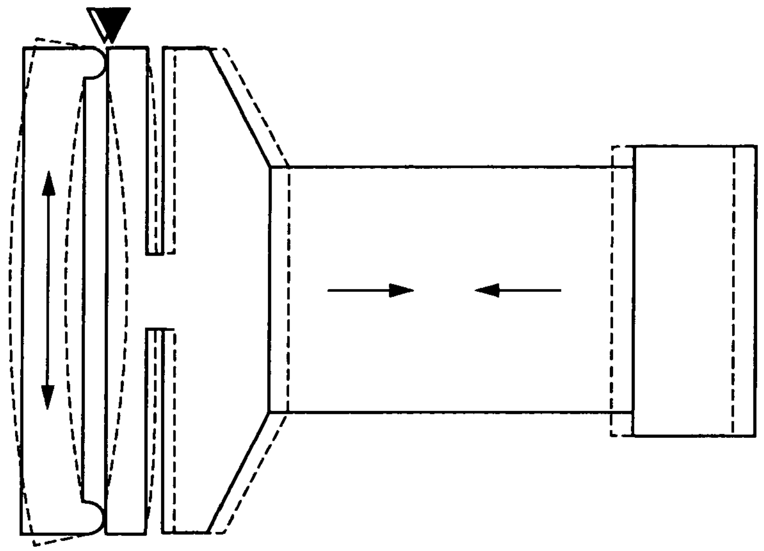
Figure 5A:
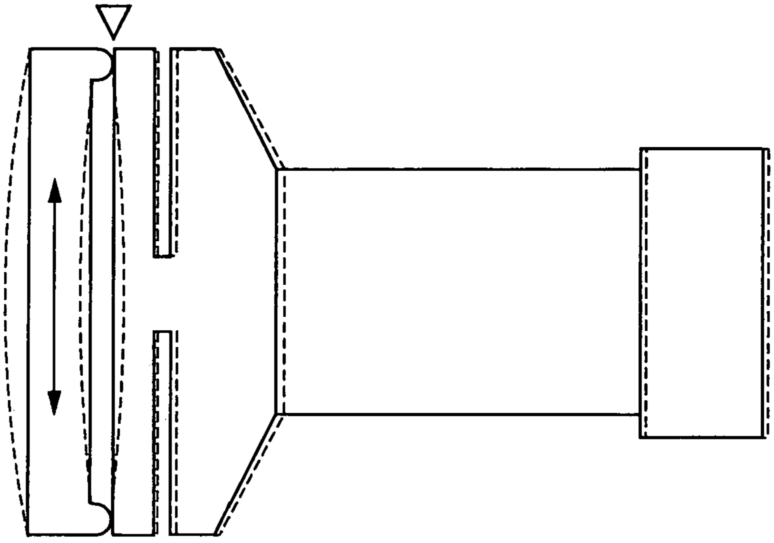

FIG. 4 is a schematic sectional diagram of the echo sounder transducer according to the second embodiment of the present invention, and FIGS. 5A to 5C include explanatory diagrams of vibration modes of the echo sounder transducer shown in FIG. 4. FIGS. 6A to 6D include explanatory diagrams showing the states of the endpoint supporting section at the time of vibration of the echo sounder transducer shown in FIG. 4 in comparison with the states of an ordinary echo sounder transducer.

The echo sounder transducer 1*b* according to this embodiment shown in these figures is a modified embodiment of the first embodiment mentioned above, and endpoint supporting sections 20 are provided as connecting means of the front mass 6 of the Langevin-type vibrator 3 and the bend vibrator 2 instead of the joint 60 shown in the first embodiment.

Hence, other components are the same as those in the first embodiment, and about the same components, the same reference numerals are assigned as those in the first embodiment, and the detailed explanation of them is omitted.

As shown in FIG. 4, connecting portions of the front mass 6 of the Langevin-type vibrator 3 and the bend vibrator 2 are the endpoint supporting sections 20.

In this embodiment, a plurality of endpoint supporting sections 20 which protrude toward a upper face section of the front mass 6 are formed in a bottom face side of the diaphragm 5 of the bend vibrator 2, and these endpoint supporting sections 20 abut against the upper face of the front mass 6 formed in the shape of a plate, and are fixed. The endpoint supporting sections 20 and front mass 6 are fixed by fixing screws 40 which are inserted from an upper face side of the diaphragm 5, penetrate the endpoint supporting sections 20, and are screwed into the front mass 6.

Because of such structure, similarly to the case in the first embodiment, the gap 6*a* is formed between the diaphragm 5 and front mass 6 so that the diaphragm 5 may become bendable.

In this way, also according to the echo sounder transducer 1*b* of this embodiment where fixed portions of the front mass 6 and diaphragm 5 are made the endpoint supporting sections 20, as shown in FIGS. 5A to 5C, similarly to the case in the first embodiment, when the Langevin-type vibrator 3 is exciting the longitudinal vibration mode, an upper portion of the front mass 6 with the slit 50 as a border can be bent in the direction of pushing up the whole bend vibrator 2 so as to keep a fulcrum of the bend vibrator 2 in the bend vibration mode in a reference position (refer to ∇ in FIG. 5A).

In addition, in the echo sounder transducer 1*b* of this embodiment where the endpoint supporting sections 20 are provided in this way, a supporting point of the bend vibrator 2 is approximately a point and fixing is performed by the vicinity of the point in contrast to the joints 60 in the first embodiment being supported and fixed by a plane. Hence, it is possible to lower a resonance frequency (refer to "f1" in FIG. 3) in the bend vibration mode rather than that in the first embodiment, and hence, it becomes possible to widen the resonance frequency in the bend vibration mode in a direction of a low frequency.

Figure 6A:
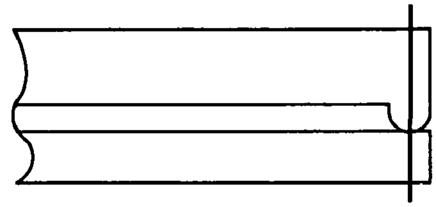
FIGS. 6A to 6D include explanatory diagrams showing the states of the endpoint supporting section at the time of vibration of the echo sounder transducer shown in FIG. 4 in comparison with the states of an ordinary echo sounder transducer.
Figure 6B:
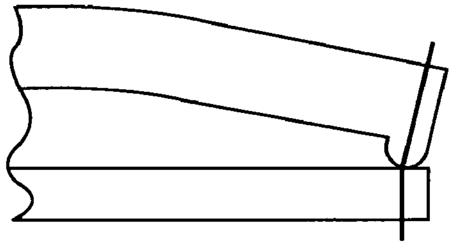
Figure 6C:
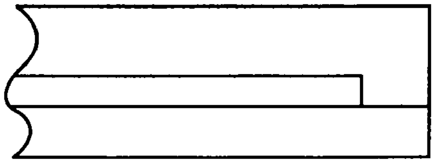
Figure 6D:
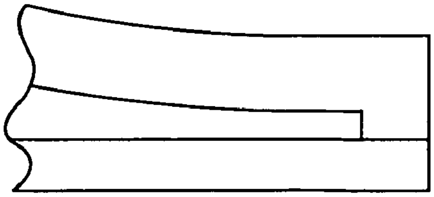

Furthermore, since the bend vibrator 2 is supported by one points to the front section of the front mass 6 by providing the endpoint supporting sections 20, as shown in FIGS. 6A and 6B, the bend vibrator 2 seems to perform roll motion according to the bend vibration mode.

Thereby, it is possible to obtain large vibration amplitude in comparison with the case of the structure (refer to FIGS. 6C and 6D) that the bend vibrator 2 and front mass 6 are joined and supported by surface contact. Hence, it becomes possible to widen the frequency band of the echo sounder transducer since it becomes easy to vibrate, and to enlarge a displacement amount without obstructing amplitude in the bend vibration mode.

Third Embodiment

Further, a third embodiment of an echo sounder transducer according to the present invention will be described with referring to FIGS. 7, 10A and 10B.

Figure 7:
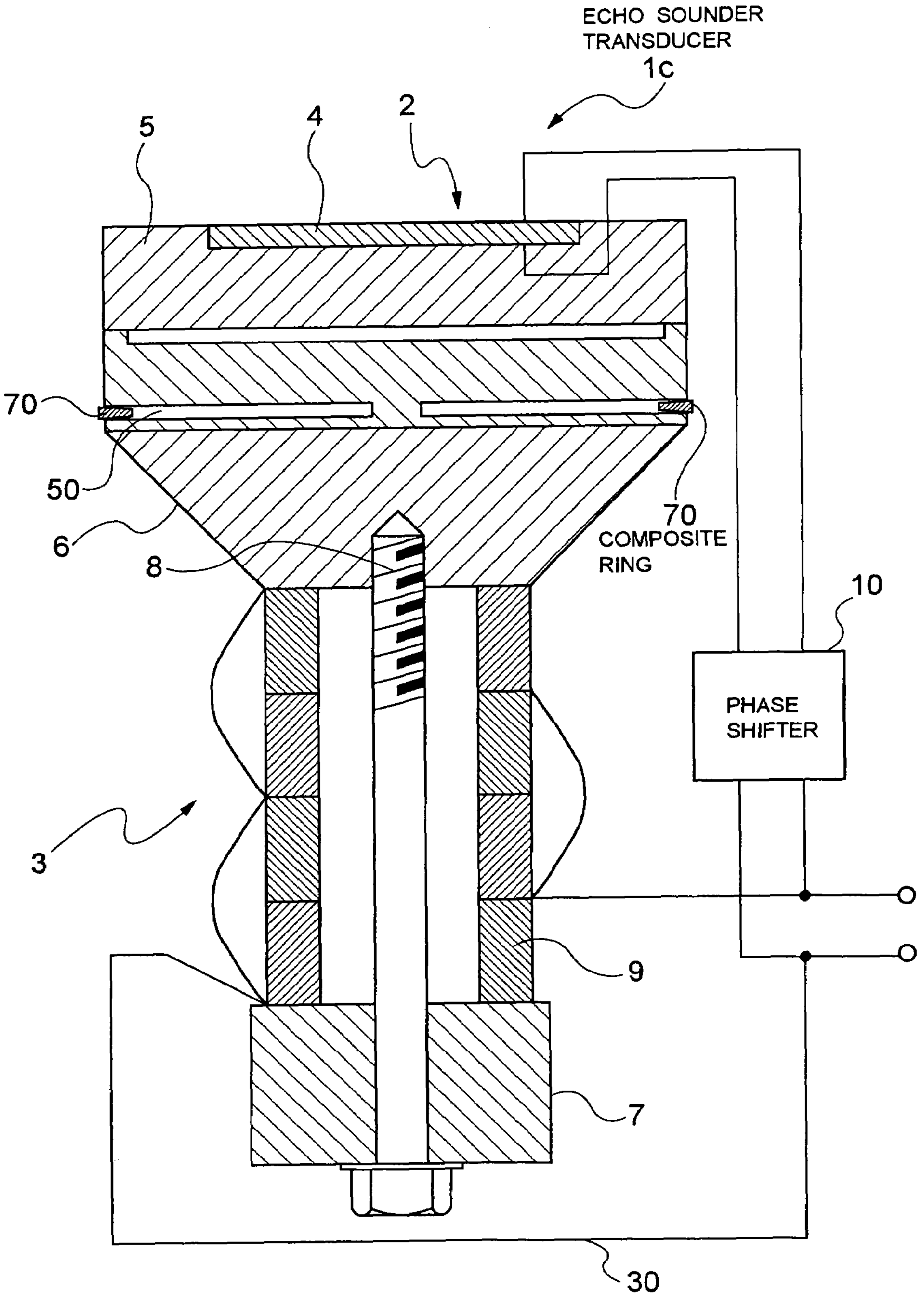
FIG. 7 is a schematic sectional diagram of an echo sounder transducer according to a third embodiment of the present invention.
Figure 8:
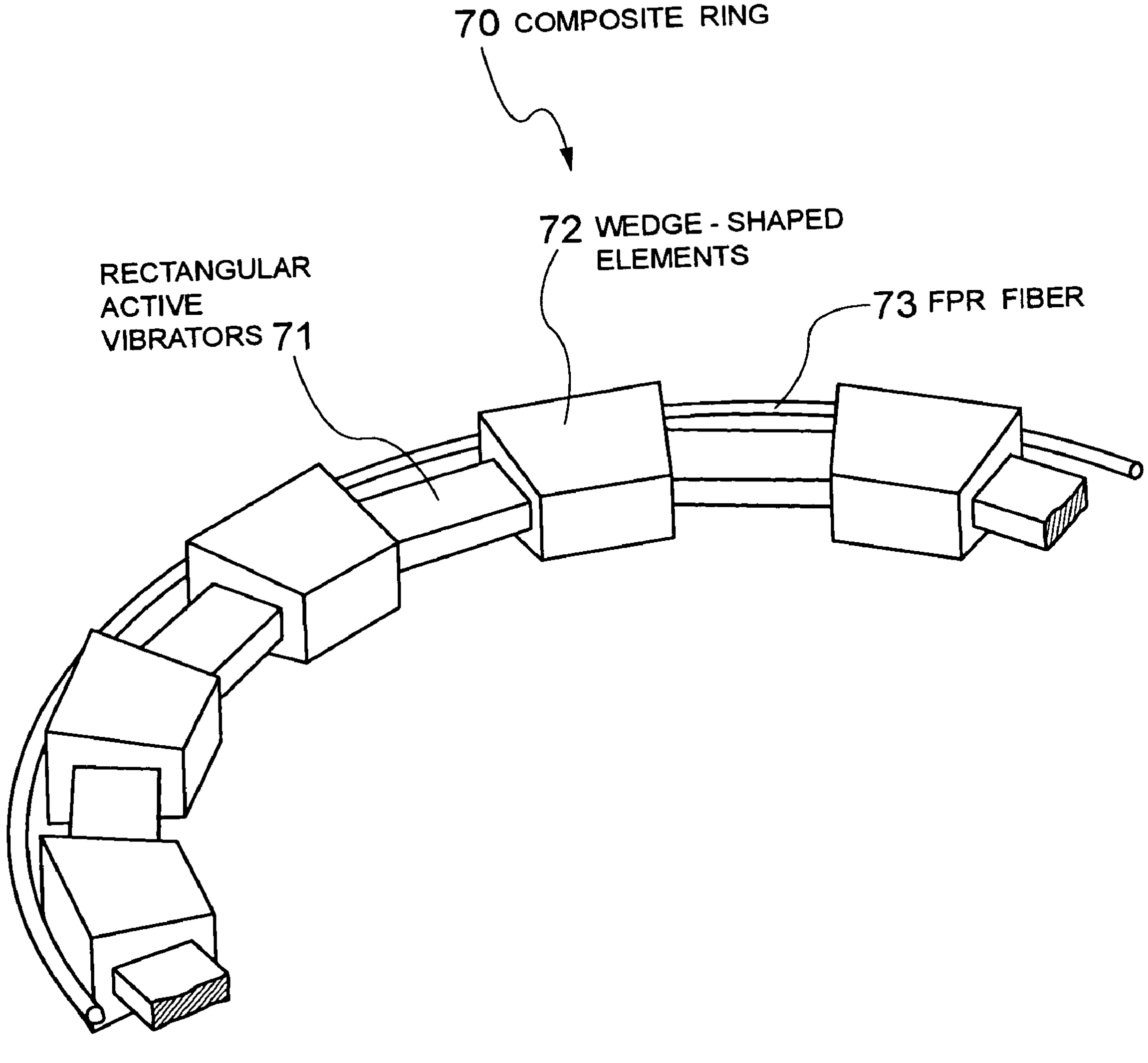
FIG. 8 is a partially schematic perspective view of a composite ring with which the echo sounder transducer shown in FIG. 7 is equipped.

FIG. 7 is a schematic sectional diagram of the echo sounder transducer according to the third embodiment of the present invention, and FIG. 8 is a partially schematic perspective view of a composite ring with which the echo sounder transducer shown in FIG. 7 is equipped.

Figure 9:
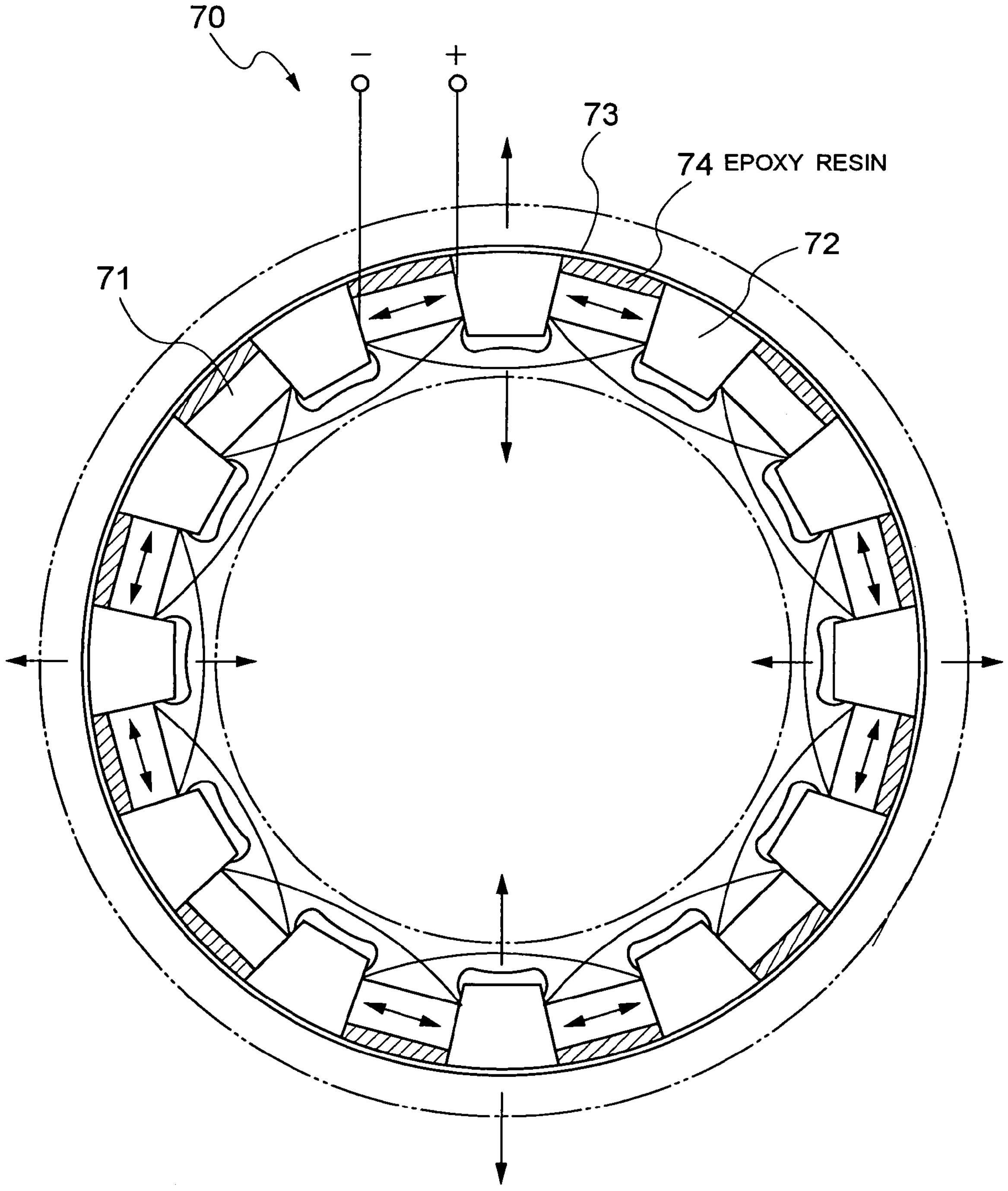
FIG. 9 is an explanatory diagram showing schematically the operation of the composite ring with which the echo sounder transducer shown in FIG. 7 is equipped.
Figure 10A:
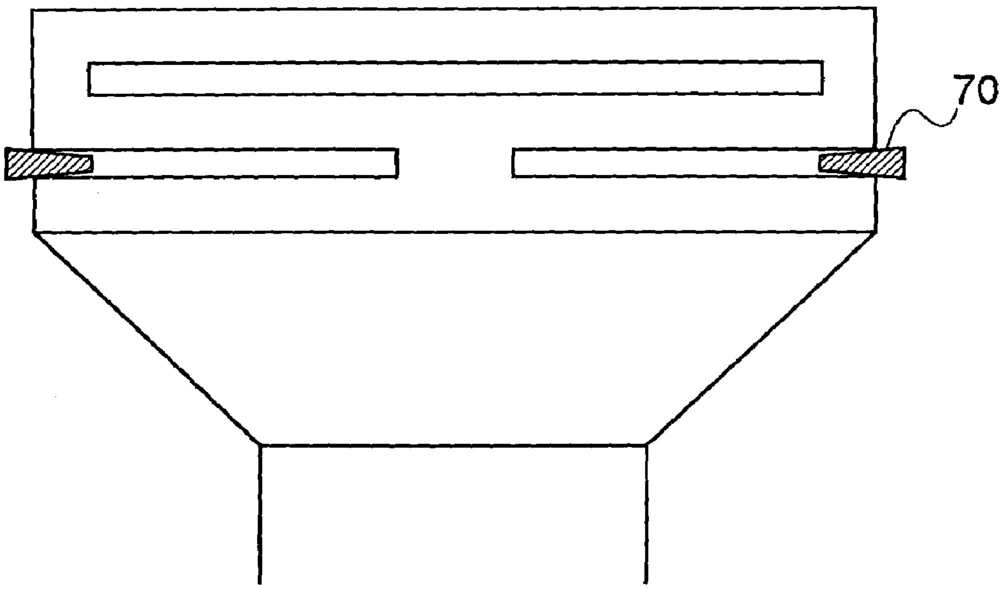
FIGS. 10A and 10B are explanatory diagrams showing schematically the operation of the echo sounder transducer shown in FIG. 7.
Figure 10B:
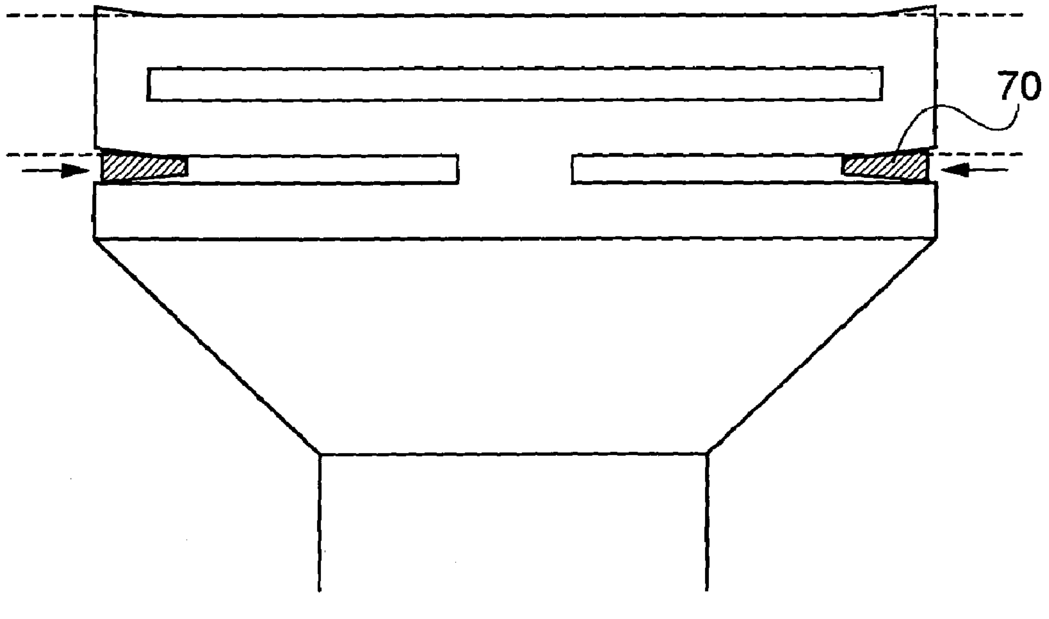

In addition, FIG. 9 is an explanatory diagram showing schematically the operation of the composite ring with which the echo sounder transducer shown in FIG. 7 is equipped, and FIGS. 10A and 10B are explanatory diagrams showing schematically the operation of the echo sounder transducer shown in FIG. 7 similarly.

As shown in these figures, an echo sounder transducer 1*c* according to this embodiment is a modified form of the first embodiment mentioned above, and a composite ring 70 is added to the echo sounder transducer 1*a* shown in FIG. 1.

The composite ring 70 constitutes front mass energizing means of energizing the acoustic radiation surface section of the front mass 6 frontward (toward the acoustic radiation surface) by changing the slit width of the slit 50 formed in the front mass 6.

Specifically, the composite ring 70 has a plurality of rectangular active vibrators 71 and wedge-shaped elements 72 which are annularly connected within the slit.

As shown in FIGS. 8 and 9, the rectangular active vibrators 71 and wedge-shaped elements 72 are arranged respectively by turns, and are consecutively connected in the slit 50 of the front mass 6 in the shape of a ring which can be engaged.

Each of the rectangular active vibrators is constituted of a vibrator extended and shrunken by a drive voltage being applied. Each of the wedge-shaped elements 72 is a solid formed in a wedge shape which has slightly larger width than the slit width of the slit 50, and the wedge-shaped elements 72 can widen the slit width of the slit 50 by being moved and fit into the slit 50 from an outer periphery side of the front mass 6 toward the axial center. These wedge-shaped elements 72 can be formed from, for example, Al, lead, or the like.

In addition, the rectangular active vibrator 71 and the wedge-shaped element 72 are consecutively connected with, for example, an adhesive, and, as shown in FIGS. 8 and 9, are hardened with an FRP fiber 73 and an epoxy resin 74 (filament winding) for their outer periphery, and are formed and maintained annularly.

Then, in such the composite ring 70, as shown in FIG. 9, the whole ring shrinks to a circumferential direction by the shrinkage of the rectangular active vibrators 71, and hence, the wedge-shaped elements 72 engaged to the slit 50 slide inside the slit to the circumferential direction to change the slit width. Then, the composite ring 70 energizes the acoustic radiation surface section of the front mass 6 forward.

Specifically, a resonance frequency of the composite ring which is constituted of the rectangular active vibrators 71 and wedge-shaped elements 72 is set to coincide with the frequency (refer to "f3" in FIG. 3) of the intermediate area in the bend vibration mode and longitudinal vibration mode which is shown in the first embodiment.

A phase of an electric signal given to the rectangular active vibrators 71 is made be the same as a phase of an electric signal given to the cylindrical active vibrators so that the composite ring 70 shrinks and extends with synchronizing with expansion and contraction of the Langevin-type vibrator 3, and is adjusted so that the rectangular active vibrators 71 may be shrunken when the total length of the plurality of cylindrical active vibrators of the Langevin-type vibrator 3 is shrunken, and consequently, the whole composite ring 70 may also vibrate in a shrunken direction.

Here, making phases be the same means to wire the same line as the cylindrical active vibrator 9 without passing a phase shifter.

By doing this, the diameter of the composite ring 70 becomes small at the time of the frequency (refer to "f3" in FIG. 3) of the intermediate area in the bend vibration mode and longitudinal vibration mode, and as shown in FIGS. 10A and 10B, the wedge-shaped elements 72 cut into in an inner diameter direction of the slit so as to forcibly widen the slit width of the slit 50 in the up-and-down direction.

Thereby, the acoustic radiation surface section of the front mass 6 is energized toward a front surface section, and can push up a position of "▼", shown in FIG. 2B of the first embodiment, further forward (toward the acoustic radiation surface).

In this way, according to the echo sounder transducer 1*c* of this embodiment, it is possible to perform the operation of bending the whole bend vibrator in a direction of pushing up it further securely, smoothly, and efficiently so as to keep the fulcrum of the bend vibrator 2 in the bend vibration mode, which is shown in the first and second embodiments, in a reference position (position shown by ∇ in FIG. 2A or 5A), by providing the composite ring 70.

In addition, it is also possible to adopt the structure except the composite ring 70 shown in this embodiment as the front mass energizing means, which can energize the acoustic radiation surface section of the front mass 6 forward (toward the acoustic radiation surface), by changing the slit width of the slit 50 of the front mass 6.

EXAMPLE 1

In the first example of the echo sounder transducer of the present invention, as the echo sounder transducer 1*a* of the first embodiment shown in FIG. 1, PZT system piezoelectric ceramic was used for the disciform active vibrator 4 and the cylindrical active vibrators 9, an aluminum alloy was used for the diaphragm 5, front mass 6, and rear mass 7, and stainless steel was used for the bolt 8.

As to the dimensional location of respective parts, let a set normalized frequency, acoustic velocity, and λ be f, C, and C/f respectively, and it was made that outer diameter of acoustic radiation surface R=0.15λ, and total length of echo sounder transducer L=0.45λ, and then, dimensions of respective parts were allocated so that a mechanical resonance frequency f1 in the bend vibration mode with the joint 60 of the bend vibrator 2 as a fulcrum might become a half of a mechanical resonance frequencies f2 of the echo sounder transducer in the longitudinal vibration mode.

In addition, the thickness T of a structural part in the side of the bend vibrator 2 of the front mass 6 with the slit 50 as a border was adjusted so that a resonance frequency of the bend vibrator 2 and a resonance frequency of the structural part in the side of the bend vibrator 2 of the front mass 6 with the slit 50 as a border might coincide mostly.

The plurality of cylindrical active vibrators 9 which constituted the Langevin-type vibrator 3 were polarized in a thickness direction, and were arranged so that polarization directions might become reverse to each other, to be electrically connected in parallel.

An electric signal was given to the leads 30 shown in FIG. 1 to excite the disciform active vibrator 4 and cylindrical active vibrator 9, and to generate mechanical vibration.

First, with making a frequency of the given electric signal be the same as a mechanical resonance frequency which is generated in the bend vibration mode of the bend vibrator 2, the bend vibration mode of the bend vibrator 2 with the joint 60 as the fulcrum occurred (the state shown in FIG. 2A and by "f1" in FIG. 3).

At this time, acoustic wave radiation was performed above the bend vibrator 2.

Then, when the frequency of the electric signal was raised gradually to be met with the same frequency f3 as an intermediate area, the bend vibrator 2 generated the bend vibration mode succeedingly, and the Langevin-type vibrator 3 generated the longitudinal vibration mode since the whole cylindrical active vibrators 9 which were stacked extended and shrunk, and thereby, the superimposing mode was generated.

Since the phase shifter 10 had performed adjustment beforehand so that the disciform active vibrator 4 and the Langevin-type vibrator 3 might be driven in reversed phases, when the Langevin-type active vibrator 3 vibrated in a shrinking direction in the longitudinal vibration mode, the bend vibrator 2 performed vibration in the bend mode in an extending direction, that is, a direction where an acoustic surface jumped out of a neutral position of the acoustic surface before driving to a positive direction (FIG. 2B and "f3" in FIG. 3).

At this time, since having been adjusted for its dimensions so as to coincide with a resonance frequency in the bend mode of the bend vibrator 2, a structure in the side of the bend vibrator 2 of the front mass 6 with the slit 50 as a border performed bend vibration so as to face with the amplitude of the bend vibrator 2 in the bend vibration mode, and also in a direction reverse to the vibration direction of the Langevin-type vibrator 3 (FIG. 2B and "f3" in FIG. 3).

Thereby, the joint 60 which became a fulcrum of the bend vibrator 2 in the bend vibration mode maintained the almost same positional relation as the position before driving (refer to "▼", shown in FIG. 2B), and hence, acoustic wave radiation was performed above the bend vibrator 2.

Furthermore, the frequency of the electric signal was set at the same as the mechanical resonance frequency f2 of the echo sounder transducer in the longitudinal vibration mode, and a longitudinal vibration mode by the expansion and contraction of the whole echo sounder transducer which included the bend vibrator 2 and the Langevin-type vibrator 3 occurred (FIG. 2C and "f2" in FIG. 3).

At this time, acoustic wave radiation was performed above the bend vibrator 2.

When the frequency characteristic (continuous line in FIGS. 2A to 2C) of the sound pressure level having been obtained in the first example of the echo sounder transducer of the present invention mentioned above is compared with the frequency characteristic (dotted line in FIGS. 2A to 2C) of the sound pressure level obtained in a conventional echo sounder transducer, the sound pressure level in the intermediate area rises from f4 to f3, and hence, it turns out that it is achieved to widen the frequency band of the echo sounder transducer with maintaining the sound pressure level.

EXAMPLE 2

As a second example of the echo sounder transducer of the present invention, the echo sounder transducer 1*b* where the joint 60 of the echo sounder transducer 1*a* shown in the first example (refer to FIG. 1) was made into the structure of the endpoint supporting sections 20 shown in FIG. 4, and where the bend vibrator 2 and the front mass 6 were fixed with the fixing screws 40 made of stainless steel was used.

When the electric signal was given to the leads 30 similarly to the first example, the same vibration mode as the vibration mode (FIGS. 2A to 2C) in the first example was excited in this echo sounder transducer 1*b*.

As to difference from the first example as an operation, since a fulcrum of the bend vibrator 2 in the bend vibration mode was approximately a point and fixing was performed by the vicinity of the point by the endpoint supporting sections 20 in contrast to the fulcrum being fixed by a plane in the first example, it was able to lower the resonance frequency in the bend vibration mode rather than f1.

In addition, when the bend vibrator 2 performed vibration in the bend vibration mode, the endpoint supporting sections 20 performed roll motion according to the bend vibration mode, and vibrated more easily.

As mentioned above, although preferable embodiments are shown and described about the echo sounder transducer of the present invention, the echo sounder transducer according to the present invention is not limited only to the embodiments mentioned above, but it is needless to say that various types of modified implementation are possible within the scope of the present invention.

As described above, the echo sounder transducer of the present invention can be used as an echo sounder transducer, for example, for long distance sonar and marine resources investigation.

What is claimed is:

1. An echo sounder transducer, comprising a Langevin-type vibrator which has a front mass, a rear mass, and a cylindrical vibrator sandwiched between the front mass and the rear mass, wherein a slit communicating from an outer peripheral side face toward an axial center is provided in the front mass of the Langevin-type vibrator;

wherein a bend vibrator arranged on an acoustic radiation surface section of the front mass of the Langevin-type vibrator is provided.

2. The echo sounder transducer according to claim 1, wherein the bend vibrator comprises a diaphragm arranged on the acoustic radiation surface section of the front mass, and a plate-like vibrator fixed to this diaphragm.

3. The echo sounder transducer according to claim 1, wherein the bend vibrator is fixed to the acoustic radiation surface section of the front mass through an endpoint supporting structure.

4. The echo sounder transducer according to claim 1, wherein the slit is formed in a position where resonance frequencies of the bend vibrator and an acoustic radiation surface section side of the front mass with the slit as a border coincide nearly.

5. An echo sounder transducer, comprising a Langevin-type vibrator which has a front mass having a slit communicating from an outer peripheral side face toward an axial center;

a rear mass;

a cylindrical vibrator sandwiched between the front mass and the rear mass; and front mass energizing means of energizing the acoustic radiation surface section of the front mass forward by changing slit width of the slit.

6. The echo sounder transducer according to claim 5, wherein the front mass energizing means comprises a composite ring which has a plurality of vibrators and wedge-shaped elements which are annularly connected within the slit; and wherein the acoustic radiation surface section of the front mass is energized forward by the composite ring shrinking and extending in a circumferential direction by shrinkage of the vibrators and the wedge-shaped elements sliding inside the slit in a circumferential direction.

7. The echo sounder transducer according to claim 6, wherein the composite ring shrinks and extends with synchronizing with shrinking and extending of the Langevin-type vibrator.

* * * * *